(12) United States Patent
Oike et al.

(10) Patent No.: US 7,291,215 B2
(45) Date of Patent: Nov. 6, 2007

(54) COATING LIQUID FOR FORMING POROUS SILICA

(75) Inventors: Shunsuke Oike, Sodegaura (JP); Kazuo Kohmura, Sodegaura (JP); Masami Murakami, Sodegaura (JP); Takeshi Kubota, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 222 days.

(21) Appl. No.: 10/554,233

(22) PCT Filed: Apr. 26, 2004

(86) PCT No.: PCT/JP2004/006041

§ 371 (c)(1), (2), (4) Date: Oct. 24, 2005

(87) PCT Pub. No.: WO2004/094311

PCT Pub. Date: Nov. 4, 2004

(65) Prior Publication Data

US 2007/0006776 A1    Jan. 11, 2007

(30) Foreign Application Priority Data

Apr. 24, 2003    (JP) ............................. 2003-120339

(51) Int. Cl.
C09D 183/02    (2006.01)
C01B 33/12    (2006.01)

(52) U.S. Cl. ............................... 106/287.16; 106/153.1

(58) Field of Classification Search ............. 106/153.1, 106/287.16
See application file for complete search history.

(56) References Cited

U.S. PATENT DOCUMENTS

| 6,294,608 | B1 * | 9/2001 | Hager et al. ................. 524/838 |
| 6,376,634 | B1 * | 4/2002 | Nishikawa et al. ........... 528/25 |
| 6,797,391 | B2 * | 9/2004 | Shibato et al. ............... 428/447 |
| 6,916,507 | B2 * | 7/2005 | Matsumura et al. ......... 427/440 |
| 2002/0042210 | A1 | 4/2002 | Mandal et al. |

FOREIGN PATENT DOCUMENTS

| JP | 2000-159509 | A | 6/2000 |
| JP | 2001-294417 | A | 10/2001 |
| JP | 2002-26003 | A | 1/2002 |
| WO | 91/11390 | A2 | 8/1991 |

OTHER PUBLICATIONS

Yanagisawa et al., "The Preparation of Alkyltrimethylammonium-Kanemite Complexes and Their Conversion to Microporous Materials," *Bull. Chem. Soc. Jpn.*,(1990), no month provided, p. 988, vol. 63, No. 4, The Chemical Society of Japan.

Yang et al., "Synthesis of oriented films of mesoporous silica on mica," *Nature* (Feb. 22, 1996,) p. 703, vol. 379.

Miyata et al., "Preferred Alignment of Mesochannels in a Mesoporous Silica Film Grown on a Silicon (110) Surface," *J. Am. Chem. Soc.*, (1999), no month provided, p. 7618, vol. 121, American Chemical Society.

Ogawa, "A simple sol-gel route for the preparation of silica-surfactant mesostructured materials," *Chem. Commun.*, (1996), no month provided, p. 1149.

Ogawa, "Preparation of transparent thin films of silica-surfactant mesotructured materials," *Supramolecular Science*, (1998), no month provided, p. 247, vol. 5, Nos. 3-4, Elsevier Science Limited, Great Britain.

Zhao et al., "Continuous Mesoporous Silica Films with Highly Ordered Large Pore Structures," *Adv. Mater.*, (1998), no month provided, p. 1380, vol. 10, No. 16, Wiley-VCH Verlag GmbH, Weinheim, Germany.

Lu et al., "Continuous formation of supported cubic and hexagonal mesoporous films gy sol-gel dip-coating," *Nature*, (Sep. 25, 1997,) p. 364, vol. 389.

Lu et al., "Aerosol-assisted self-assembly of mesostructured spherical nanoparticles," *Nature*, (Mar. 18, 1999) p. 223, vol. 398.

Kruk et al., "New insights into pore-size expansion of mesoporous silicates using long-chain amines," *Microporous and Mesoporous Materials*, (2000,) no month provided, p. 545, vol. 35-36, Elsevier Science B.V.

* cited by examiner

*Primary Examiner*—David M. Brunsman
(74) *Attorney, Agent, or Firm*—Buchanan Ingersoll & Rooney PC (57) ABSTRACT

The coating liquid for forming porous silica according to the present invention is characterized by preferably containing a partial hydrolysis-condensation product of an alkoxysilane compound, a surfactant and an organic ampholyte, and by having a metal content of not more than 50 ppb. Conventional coating liquids for forming porous silica have such a problem that porous silica films formed therefrom may have poor regularity in micropore alignment when the shelf life of the coating liquids are long. On the contrary, the coating liquid for forming porous silica of the present invention is excellent in self-life stability. Namely, the quality of porous silica formed therefrom is hardly affected by the length of self-life period of the coating liquid. Consequently, the coating liquid is expected to contribute to the stable preparation of porous silica films which cause no shift in capacitance or voltage when exposed to an electric field, have regularly aligned uniform micropores, and are preferably used as an optically functional material or an electronically functional material.

5 Claims, 2 Drawing Sheets

COATING LIQUID FOR FORMING POROUS SILICA

RELATED APPLICATIONS

This application is a 371 filing of PCT/JP04/06041, filed 26 Apr. 2004.

TECHNICAL FIELD

The present invention relates to a coating liquid for forming porous silica in order to form porous silica which can be used for an optically functional material, an electronically functional material and the like or a film thereof.

BACKGROUND ART

In recent years, porous inorganic compounds having uniform micropores (micropore diameter: 2 to 50 nm) has been developed. The porous inorganic compounds have larger micropores, a larger pore volume and a larger surface area than an oxide such as zeolite and the like that has been used from the past so that application of those compounds to a catalyst carrier, a separation adsorbent, a fuel cell, a sensor or the like has been studied.

As a method for preparing a porous material having these uniform micropores, a method utilizing control of the structure of an inorganic compound by the use of an organic compound has been paid attention. In particular, it has been known that an oxide having uniform micropores, that is formed by utilizing a cooperative organization (self-organization) due to an interaction between an organic compound and an inorganic compound, has a larger pore volume and a larger surface area than the conventional zeolite and the like.

There has been disclosed a method for preparing a porous material having uniform micropores utilizing a cooperative self-organization due to an interaction between an organic compound and an inorganic compound, for example, in WO 91/11390. Specifically, a method comprising subjecting a precursor solution comprising a silica gel, a surfactant and the like to a hydrothermal synthesis in a heat-resistant closed vessel to prepare porous silica has been disclosed.

Furthermore, in Bull. Chem. Soc. Jp., Vol. 63, p. 988 (1990), a method comprising subjecting kanemite that is a kind of a layered silicate and a surfactant to ion exchange to prepare such a porous material has been disclosed.

In order to use a porous material having uniform micropores for an optically functional material, an electronically functional material or the like, there has been recently reported a method for preparing porous silica in the form of a film. For example, in Nature, Vol. 379, p. 703 (1996), J. Am. Chem. Soc., Vol. 121, p. 7618 (1999) or the like is described a method for forming a film by immersing a substrate in a sol solution comprising a condensation product of alkoxysilanes and a surfactant, and depositing porous silica having uniform micropores on the substrate surface.

Furthermore, in Chem. Commun., p. 1149 (1996), Supramolecular Science, Vol. 5, 247 (1998), Adv. Mater., Vol. 10, p. 1280 (1998), Nature, Vol. 389, p. 364 (1997), Nature, Vol. 398, p. 223 (1999), or the like is described a method for forming a film on a substrate by coating the substrate with a coating liquid in which a condensation product of alkoxysilanes and a surfactant are mixed in an organic solvent, and subsequently evaporating the organic solvent.

When the porous film having uniform micropores is used as a low permittivity insulating film of an integrated circuit, it is required that a metal ion such as an alkali metal including sodium or potassium, or the like is strictly removed. A positively charged ion, when exposed to an electric field, easily moves, because of its drift from a positively biased film to a negatively biased film, causing the shift in capacitance or voltage. Accordingly, in order to obtain a porous film which is preferably used as an insulating film of an optically functional material and an electronically functional material, it is required that a metal, i.e., an impurity is not contained in a coating liquid used for preparing a porous film. Namely, in order to prepare such a coating liquid, it needs to remove a metal, i.e., an impurity, from a surfactant, an organic solvent or the like used as a raw material.

However, when a metal ion such as an alkali metal ion or the like is removed from the coating liquid, zeta potential of a silica oligomer in the coating liquid is changed, and the mesophase of the silica oligomer and the surfactant becomes unstable. As a result, there has been a problem such that the regularity in micropores is deteriorated due to the time from the preparation of a coating liquid until coating. Consequently, a coating liquid such that the regularity in micropores or the permittivity of the obtained porous silica film becomes uniform regardless of the shelf life, even if a metal ion is removed, has been in demand.

In order to solve the problem, for example, in JP2002-26003A is described that, even if a metal ion is removed, a porous silica film having uniform micropores is obtained regardless of the shelf life when a coating liquid containing a tetraalkylammonium salt, a tetraorgano ammonium salt or an organoamine in an acidic medium is used.

However, there are problems such that the tetralkylammonium salt, the tetraorgano ammonium salt and organoamine are expensive, and organoamine is very toxic.

Furthermore, in Microporous and Mespporous materials, Vols. 35-36, p. 545 (2000), organoamine is described, which penetrates into the inside of the surfactant, affecting the regularity in micropores or a pore size. For this reason, when an amine described in JP2002-26003A is used as a coating liquid, physical properties such as the mechanical strength or the like of the obtained porous silica can be possibly deteriorated.

Under the circumstances, a coating liquid for forming porous silica having the following properties has been in demand, porous silica which does not cause the shift in capacitance or voltage is obtained even when it is exposed to an electric field;

the regularity in micropores, the permittivity or the mechanical strength of the obtained porous silica is not changed regardless of its self-life time;

the cost is cheap; and the safety is high.

DISCLOSURE OF THE INVENTION

The present invention is to solve the problems accompanying the background art as described above. That is, an object of the present invention is to provide a coating liquid for forming porous silica which can be used for an optically functional material, an electronically functional material or the like, which can form a porous film that does not practically contain a metal ion, in which the quality of the obtained porous silica film is uniform regardless of the self-life period (hereinafter referred to as the self-life stability in some cases), and in which a porous silica film having uniform micropores is obtained.

The coating liquid for forming porous silica according to the present invention comprises (A) an alkoxysilane compound, (B) a surfactant and (C) an organic ampholyte, and having a metal content of not more than 50 ppb.

(C) The organic ampholyte for the aforementioned coating liquid for forming porous silica is preferably (C1) an amino acid and/or peptide.

The coating liquid for forming porous silica preferably contains (C) the organic ampholyte in the amount of from 0.1 to 6000 ppm.

(A) The alkoxysilane forming the coating liquid for forming porous silica of the present invention is preferably a partial hydrolysis-condensation product of (A1) an alkoxysilane compound.

The coating liquid for forming porous silica of the present invention preferably has the $W_{CR}$ value defined by the following formula in the range of 0.5 to 3.0, $$W_{CR}=W_C/(60.09 \times M_{Si}) \quad \text{(Formula 1)}$$

wherein $W_C$ represents a mass of (B) the surfactant (unit: gram); and $M_{Si}$ represents the molar amount of (A) the alkoxysilane compound in terms of silicon.

THE BEST MODE FOR CARRYING OUT THE INVENTION

The coating liquid for forming porous silica having excellent self-life stability according to the present invention is described in more detail below. Furthermore, in the present invention, the meaning of a liquid includes a solution, a suspension, an emulsion and the like in some cases.

[Coating Liquid for Forming Porous Silica]

The coating liquid for forming porous silica according to the present invention (hereinafter referred to as a coating liquid) comprises (A) an alkoxysilane compound, (B) a surfactant and (C) an organic ampholyte. Alkoxysilane compounds and surfactants that have been used for the conventional coating liquids for forming porous silica can be used for (A) the aforementioned alkoxysilane compound and (B) the surfactant without restrictions. However, (C) the organic ampholyte or an organic amide compound to be described below is not included in the conventional coating liquid for porous silica.

As a preferred method for obtaining this coating liquid, a method comprising mixing (A) an alkoxysilane compound, (B) a surfactant, an acid catalyst, water, an organic solvent and (C) an organic ampholyte, and subjecting (A) the alkoxysilane compound to a partial hydrolysis-dehydrative condensation can be cited. As far as it is not contrary to the object of the present invention, other components in addition to the above components may be contained in the aforementioned coating liquid. For example, an amide compound or the like is preferably used in forming a porous silica film as it can enhance the smoothness of a film.

In order to obtain porous silica which does not cause the shift in capacitance or voltage, the metal content of the coating liquid of the present invention needs to be not more than 50 ppb.

When the coating liquid of the present invention is used for forming a porous silica film, the coating liquid preferably maintains its fluidity to such an extent that a film can be formed when coating the surface of a substrate such as a wafer or the like by a spin coating method, a dip coating method or the like. Furthermore, it is also a preferred embodiment that a liquid is at a state that a locally condensed gel type particle affecting the smoothness of a film is not formed.

The meaning of a metal content of a coating liquid in the present invention include the content of all metal ions which are generally defined as a metal such as an alkali metal ion, an alkaline-earth metal ion, a transition metal ion or the like.

Usually, when the metal content of the coating liquid becomes not more than 50 ppb, and the self-life period of the coating liquid is long, there are some defects such that a film formed therefrom may have remarkably poor regularity in micropores and the like in many cases.

The present inventors have repeatedly conducted an extensive study in order to overcome the defects. As a result, they have found that, when (C) the organic ampholyte is present in the coating liquid, even if a metal content is not more than 50 ppb, the foregoing defects have been considerably corrected. Namely, even-when the coating liquid is kept for a long period of time, a film formed therefrom has high regularity in micropores.

As described above, there has been reported that a coating liquid containing a tetraalkylammonium salt, a tetraorgano ammonium salt, organoamine or the like can also be stored for a long period of time. However, as compared to these compounds, (C) the aforementioned organic ampholyte can be available with a cheaper price and it is highly safe as well. Furthermore, the coating liquid of the present invention has much higher long-term self-life property.

The reason why the liquid stability of the coating liquid of the present invention is kept for a long period of time is assumed as follows. There has been reported that the compound such as the aforementioned organoamine can suppress a change in zeta potential of a silica precursor in the coating liquid, but it penetrates into the inside of a micelle of a surfactant, resulting in influencing on the regularity in mesopores or its size. On the contrary, since (C) the organic ampholyte used for the coating liquid of the present invention has high polarity, the compound is expected not to penetrate into the aforementioned micelle or its difficulties in penetrating into the micelle are expected. For this reason, (C) the organic ampholyte is considered to show only an effect of suppressing a change in zeta potential without interrupting functions that controls the regularity in mesopores or its size of (B) the surfactant.

Each component used for the preparation of the coating liquid for forming porous silica in the present invention is explained in more detail below.

((A) Alkoxysilane Compound)

Alkoxysilane that has been used for coating liquids from the past can be used for (A) an alkoxysilane compound constituting the coating liquid of the present invention without any particular restrictions. The alkoxysilane compound preferably comprises alkoxysilane having Si—O—Si bonds. A partial hydrolysis-condensation product of (A1) alkoxysilane is more preferable.

As (A) the alkoxysilane compound to be used for the present invention, an alkoxysilane compound represented by the following general formula (I) and/or the following general formula (II) can be particularly preferably cited, $(C_YH_{2Y+1}O)_{4-n}Si((CH_2)_a(CF_2)_b(O(CF_2)_c)_dX)_n$      (I)

wherein, in the formula, Y is an integer of 1 to 4; n is an integer of 0 to 3; a is an integer of 0 to 3; b is an integer of 0 to 10; c is an integer of 1 to 3; d is an integer of 0 to 3; and X represents any one of F, $OCF_3$, $OCF(CF_3)_2$, $OC(CF_3)_3$ and $C_6H_eF_{(5-e)}$ (in the formula, e is an integer of 0 to 4), and $(C_zH_{2z+1}O)_3SiRSi(OC_zH_{2z+1})_3$      (II)

wherein, in the formula, Z is an integer of 1 to 4; and R represents an alkyl group or a phenyl group.

As the alkoxysilane compound, an alkoxysilane compound as described in JP2003-89513A and the like can be preferably cited.

In the present invention, (A) the alkoxysilane compound can also be used in combination of 2 or more kinds. Use of tetraethoxysilane is particularly preferable. By using tetraethoxysilane, it is possible to easily control the hydrolysis reaction at a room temperature.

An alkoxysilane compound which does not contain a metal is preferably used for (A) the alkoxysilane compound according to the present invention. As a method for obtaining (A) the alkoxysilane compound as described above, a method comprising removing a metal from the alkoxysilane compound by carrying out distillation purification or ion exchange can be properly cited. Furthermore, a product that has been commercialized as a grade for an electronic material can also be used as it is.

((B) Surfactant)

The (B) surfactant to be used for the preparation of the coating liquid of the present invention is not particularly restricted and all surfactants that have been used for coating liquids from the past can be preferably used. A surfactant having a polyalkyleneoxide structure can be more preferably cited. Concrete examples of a surfactant having a polyethyleneoxide structure, a polypropyleneoxide structure, a polytetramethyleneoxide structure, a polybutyleneoxide structure and the like include a block copolymer of the aforementioned polyalkyleneoxide, alkylether of the above polyalkyleneoxide, or the like.

More concrete examples of (B) the surfactant include a surfactant as described in JP2003-89513A and the like.

In the present invention, the surfactants can also be used in combination of 2 or more kinds. Furthermore, the surfactant in any state of a solid, an undefined phase, a liquid, a solution or the like may be good.

As (B) the surfactant according to the present invention, a surfactant which does not contain a metal is preferably used. As a method for obtaining the surfactant as described above, a method comprising removing a metal by carrying out ion exchange using a commercial cation exchange resin can be properly cited. Furthermore, a product that has been commercialized as a grade for an electronic material can also be used as it is.

The coating liquid for forming porous silica of the present invention has the content of (A) the alkoxysilane compound and (B) the surfactant preferably in the range of 0.5 to 3.0 of the $W_{CR}$ value represented by the following formula 1, and more preferably in the range of 0.5 to 2.0, $W_{CR}=W_C/(60.09 \times M_{Si})$      (Formula 1)

wherein, $W_C$ is a mass of (B) the surfactant (unit: gram); and $M_{Si}$ is the molar amount of (A) the alkoxysilane compound in terms of silicon.

When the porous silica to be described later is prepared by using the coating liquid for forming porous silica of the present invention, most of silicon in (A) the alkoxysilane compound is considered to be silicon in the porous silica. The general composition formula of silica is $SiO_2$ (molecular weight: 60.09), while the aforementioned $W_{CR}$ value can be considered as an index that defines the weight part of (B) the surfactant necessary for preparing 1 weight part of the porous silica.

The content of (B) the surfactant contained in the coating liquid for forming porous silica of the present invention is rather preferably defined as a molar ratio to the (A) the alkoxysilane compound in terms of a silicon atom in some cases. In this case, (B) the surfactant is used to have the molar ratio of preferably from 0.003 to 0.20, more preferably from 0.003 to 0.10, more preferably from 0.003 to 0.05, and further preferably 0.005 to 0.03, and particularly preferably from 0.007 to 0.02, based on the molar ratio to the (A) the alkoxysilane compound. The aforementioned range of the molar ratio is proper in many cases when a surfactant having a relatively large molecular weight such as a block copolymer of the above-mentioned polyalkyleneoxide or the like is used.

The porous silica coating liquid in which (B) the surfactant according to the present invention satisfies the above range highly enhances the regularity in micropore structure or the void fraction (porosity) in many cases, since the ratio of silica incapable of contributing to a cooperative organization due to an interaction between the alkoxysilane compound and the surfactant is reduced. Furthermore, it is also advantageous from the viewpoint of forming a hexagonal periodic crystal structure having uniform micropores, while it is advantageous that the structure hardly collapses in many cases even in the calcining process when forming the porous silica to be described later.

(Acid Catalyst, Water, and Organic Solvent)

In order to obtain a partial hydrolysis-condensation product of the above alkoxysilane, an acid catalyst, water, and an organic solvent are preferably used. As the aforementioned acid catalyst, water, and the organic solvent, all known compounds that have been used for the preparation of coating liquids from the past can be used without any restrictions.

((C) Organic Ampholyte)

(C) The organic ampholyte constituting the coating liquid of the present invention is assumed to have an ability to stabilize zeta potential of an alkoxysilane compound which becomes unstable by removing a metal element, thereby resulting in considerably enhancing the self-life stability of the coating liquid. Furthermore, (C) the organic ampholyte to be used in the present invention is different from (B) the surfactant.

As preferred examples of (C) the organic ampholyte according to the present invention, there can be exemplified, for example, an amino acid, peptide, i.e., a polymer of the amino acid and the like can be cited. The amino acid or peptide has at least two or more of acid dissociation constants in a solvent with ion strength $(mol/dm^{-3})$ of from 0 to 0.2. The acid dissociation constants thereof are preferably included both in the range of 0 to 4 and in the range of 7 to 13. (C) The organic ampholyte according to the present invention can also be used in combination of 2 or more kinds. For example, it can be used in combination of an amino acid and peptide. At this time, the amino acid and peptide may be reacting with each other.

As (C) the organic ampholyte according to the present invention, an amino acid is particularly preferable because it is cheap and highly safe as well.

As an amino acid which can be used for the present invention, there can be exemplified, for example, azaserine, asparagine, aspartic acid, amino butyric acid, alanine, arginine, alloisoleucine, allothreonin, isoleucine, ethionine, ergothioneine, ornithine, canavanine, kynurenine, glycine, glutamine, glutamic acid, creatine, sarcosine, siltathionine, cystine, cysteine, cysteine acid, citrulline, serine, taurin, thyroxine, tyrosine, tryptophan, threonin, norvaline, norleucine, valine, histidine, 4-hydroxy-L-proline, hydroxy-L-ricin, phenylalanine, proline, homoserine, methionine, 1-methyl-L-histidine, 3-methyl-L-histidine, L-lanthionine, L-ricin, L-leucine and the like. Of these, use of glycine is particularly preferable. The aforementioned amino acid can also be used in combination of 2 or more kinds.

Furthermore, peptide which can be used for the present invention is oligopeptide bonded by peptide bonds of 2 to 10 amino acids and polypeptide bonded by peptide bonds of more than 2 to 10 amino acids.

Concrete examples of such peptide include carnosine, dultathionine, diketopiperazine and the like.

Peptide can also be used in combination of 2 or more kinds.

As (C) the organic ampholyte according to the present invention, an organic ampholyte which does not contain a metal is preferably used. As a method for obtaining the above-mentioned (C) organic ampholyte, a method for obtaining, for example, glycine can be cited as described in JP1998-130214A. Such a method comprising adding ammonia and carbon dioxide to glycolonitrile in a solution and heating the mixture to obtain glycine which does not contain various metals including sodium can be cited. Furthermore, a method comprising removing a metal from the organic ampholyte by carrying out distillation purification or ion exchange can be properly cited.

(Amide Compound)

The coating liquid of the present invention comprising a configuration including an amide compound as described above is also a proper example. There is an advantage such that a porous silica film having much excellent smoothness is obtained from the coating liquid comprising an amide compound. Furthermore, the amide compound according to the present invention does not include (C) the organic ampholyte. As such an amide compound, an amide compound as described in JP2003-89513A can be preferably cited.

Of the aforementioned amide compounds, an amide compound having its boiling point of less than 200° C., preferably not less than 150° C. and less than 200° C. is preferably used. When the boiling point is less than 200° C., it is easy to remove the amide compound during the preparation of the porous silica film to be described later so that a porous silica film having uniform micropores regularly disposed can be easily obtained. As such an amide compound, N,N-dimethylacetamide is particularly preferable.

In the present invention, as the amide compound, use of an amide compound which does not contain a metal is preferable. As a method for obtaining such an amide compound, a method comprising removing a metal from the amide compound by carrying out distillation purification, ion exchange or the like. Furthermore, as such an amide compound, an amide compound for use in an electronic material that has been generally commercialized can be used.

[Method for Preparing a Coating Liquid for Forming Porous Silica]

The coating liquid for forming porous silica according to the present invention can be prepared in accordance with all known preparation methods of coating liquids. As a preferred example, a method for preparing a coating liquid which comprises a partial hydrolysis-condensation product of the alkoxysilane compound, (B) the surfactant and (C) the organic ampholyte, and satisfies the metal content of not more than 50 ppb is described.

An operation may be preferably carried out in a clean room that has been managed not to allow a metal to enter into a solution. A vessel or an apparatus is used, which is subjected to a demetallization treatment by washing with a 10 weight % sulfuric acid, and then washing with demetallized water. Furthermore, a raw material does not contain a metal, i.e., an impurity or the aforementioned raw materials such as an acid catalyst, water, an organic solvent, an amide compound and the like are used in this example, in addition to (A) the alkoxysilane compound, (B) the surfactant, (C) the organic ampholyte which are subjected to a demetallization treatment for removing a metal, i.e., an impurity.

Firstly, in the presence of (B) the surfactant, a reaction solution is obtained by carrying out a partial hydrolysis-dehydrative condensation reaction of (A) the alkoxysilane compound: Furthermore, the meaning of a liquid in the present invention includes a solution, a suspension, an emulsion and the like in some cases. The hydrolysis-dehydrative condensation reaction is carried out in the presence of an acid catalyst and water. It is preferably carried out further in the presence of an organic solvent.

More specifically, the following methods can be cited, (1) a method comprising feeding (A) an alkoxysilane compound, (B) a surfactant, an acid catalyst, water and an organic solvent as needed into a reactor and stirring for several minutes to 5 hours or so;

(2) a method comprising feeding (A) an alkoxysilane compound, an acid catalyst, water and an organic solvent as needed into a-reactor and stirring for about 10 minutes to 5 hours, subjecting (A) the alkoxysilane compound to a partial hydrolysis-dehydrative condensation reaction, adding (B) a surfactant thereto, and stirring for several minutes to 5 hours or so; and the like.

The aforementioned components may be used in combination of 2 or more kinds in advance. For example, use of hydrochloric acid can be considered as using a mixture of an acid catalyst and water. In the above method, each component can be divided into several parts and used on a plurality of occasions. In particular, water is preferably divided into several parts and used on a plurality of occasions since an effect of the self-life stability is highly enhanced.

It is desired that water is used in the amount of from 0.5 to 20 moles, preferably in the amount of from 1 to 20 moles, and more preferably in the amount of from 1.2 to 15 moles, based on 1 mole of (A) the alkoxysilane compound (in terms of a silicon atom).

When water is divided into several parts and used on a plurality of occasions, the number of the use of water is not particularly restricted, but it is desirable to add water used for the first time n the amount of from 0.10 to 0.30 mole, preferably in the amount of from 0.12 to 0.30 mole, and further preferably in the amount of from 0.15 to 0.30 mole, based on 1 mole of an alkoxy group of (A) the alkoxysilane compound.

When the amount of the above water is more than 0.30 mole, based on 1 mole of an alkoxy group of (A) the alkoxysilane compound, gelation of the alkoxysilane compound takes place in some cases. Furthermore, the time when water is used for the first time is preferably before (B) the surfactant is used. On the other hand, the time for the use of (B) the surfactant is preferably before water is used for the second time.

The time for the addition of water is desired to be after water used for the first time is consumed in the amount of not less than 0.10 mole and preferably not less than 0.12 mole by the hydrolysis, based on 1 mole of an alkoxy group of (A) the alkoxysilane compound. The amount of water consumed by the hydrolysis can be confirmed generally by the Karl Fischer analysis. When water used for the first time is consumed in the amount of not less than 0.10 mole, based on 1 mole of an alkoxy group of (A) the alkoxysilane compound, by the hydrolysis of (A) the alkoxysilane compound, the number of addition of water thereafter and the time of addition are not particularly restricted.

In this manner, after the hydrolysis-dehydrative condensation reaction reaction of (A) the alkoxysilane compound is progressed, the resultant comes in contact with (B) the surfactant. Then, the effect of additionally used water is small in many cases. This is considered because the liquid is relatively stabilized by the interaction between the alkoxysilane compound which is properly subjected to the hydrolysis-dehydrative condensation reaction and (B) the surfactant. That is, a method comprising using water on a plurality of occasions like this is advantageous since a coating liquid which is excellent in the self-life stability can be obtained, as compared to a method comprising using water at a time.

The aforementioned acid catalyst is used in the amount of from 0.001 to 0.05 equivalent mole, based on 1 mole of the alkoxysilane compound (in terms of a silicon atom). The organic solvent is not particularly restricted, but it is used in the amount to have a volume of from 3 to 20 times, (A) the alkoxysilane compound.

Next, the thus-obtained reaction solution comes in contact with (C) the organic ampholyte. Of course, (C) the organic ampholyte may be used in the middle of the above reaction. In the present invention, (C) the organic ampholyte plays an important role in enhancing the self-life stability. Because the zeta potential of a partial condensation product of (A) the alkoxysilane compound which is unstabilized by removing a metal ion present in a solution at the state of cation is usually considered to become stabilized by (C) the organic ampholyte. On the other hand, (C) the organic ampholyte might possibly hinder progress of the cooperative organization by the interaction between (B) the surfactant and a partial condensation product of (A) the alkoxysilane compound. For that reason, the self-life stability of the coating liquid tends to be greatly affected by the time of the above reaction solution coming in contact with (C) the organic ampholyte and the use of (C) the organic ampholyte.

In the above method, there is a method comprising determining the time of the use of (C) the organic ampholyte after the confirmation of condensation degree of (A) the alkoxysilane compound, but the elapsed time after (A) the alkoxysilane compound comes in contact with an acid catalyst, and water can be used instead. Since the hydrolysis-dehydrative condensation reaction of (A) the alkoxysilane compound starts after (A) the alkoxysilane compound comes in contact with the acid catalyst and water, the condensation degree can be controlled by the reaction time.

The time of the use of (C) the organic ampholyte cannot be uniformly defined because it is different depending on the types of alkoxysilane in use or the like, but (C) the organic ampholyte is required to be used after (A) the alkoxysilane compound, the acid catalyst, and water come in contact with one another, followed by stirring for 30 minutes to 24 hours, preferably for 45 minutes to 12 hours and further preferably for 1 to 4 hours.

When water is divided into several parts and used on a plurality of occasions, it is required that (C) the organic ampholyte is used after feeding of the last water is completed, followed by stirring for 0 to 24 hours, preferably 0 to 12 hours, and more preferably for 0 to 4 hours.

In this manner, particularly by controlling the amount, the time of use, and the like of water, (B) the surfactant, and (C) the organic ampholyte, the condensation degree of (A) the alkoxysilane compound can be maintained in the optimum state so that the self-life stability of the obtained coating liquid can be further improved.

Meanwhile, the aforementioned (C) organic ampholyte is contained in the amount of from 0.1 to 6000 ppm, preferably in the amount of from 50 to 5000 ppm, more preferably in the amount of from 100 to 4000 ppm in the coating liquid. (C) The organic ampholyte comes in contact with the reaction solution, preferably followed by stirring for about 1 to 30 minutes. When the content of (C) the organic ampholyte is within this range, the self-life stability of the obtained coating liquid is particularly enhanced. So, even when the coating liquid is kept for a long period of time, the obtained silica film exhibits high regularity in micropore alignment.

An amide compound as described above may further be fed into the coating liquid of the present invention.

The time of the use of the amide compound is preferably the same as that of (C) the organic ampholyte. Furthermore, the amide compound may be fed at the same time with (C) the organic ampholyte or may be fed separately. Further, the time of stirring after the use of the amide compound is not particularly restricted as far as the amide compound is practically uniformly mixed in the coating liquid.

The amount of the aforementioned amide compound used is desired to be contained in the amount of from 1 to 60 volume %, and preferably in the amount of from 5 to 35 volume %, based on 100 volume % of the reaction solution. When the amount of the amide compound added is within this range, the self-life stability of the coating liquid is particularly enhanced and a porous silica film having excellent surface smoothness can be obtained at the same time.

In the present invention, after a coating liquid is prepared by using a raw material containing a metal, a metal ion is removed from the coating liquid to have a metal content of not more than 50 ppb in some cases.

The metal content of the thus-obtained coating liquid for forming porous silica can be confirmed, for example, by carrying out the inductively coupled plasma atomic emission spectroscopy.

The composition, the degree of condensation or the like of the coating liquid for forming porous silica of the present invention can be easily analyzed by the known analytic methods. Examples thereof include elementary analysis, infrared spectroscopy, ultraviolet spectroscopy, nuclear magnetic resonance (NMR) spectrum, liquid chromatography, gas chromatography, gel permeation chromatography and the like.

[Method for Preparing Porous Silica and a Porous Film]

As a method for forming porous silica or a porous silica film using the coating liquid for forming porous silica of the present invention, preparation methods using known coating liquids can be used without restrictions. A method comprising coating a base material with the aforementioned coating liquid, followed by drying, and further removing (B) the surfactant, (C) the organic ampholyte, and the amide compound to be used as needed by calcination or extraction can be cited.

Porous silica or the porous silica film obtained by using the coating liquid of the present invention has low permittivity and high regularity in micropore alignment, and also has superior strength. A film thickness of the porous silica film is not particularly restricted because its preferred range is different according to the applications. For example, when the porous silica film is used as an interlayer insulating film, its film thickness is required to be from 0.1 to 1 μm, and preferably from 0.2 to 1 μm. By regulating the film thickness to be within this range, a film with a proper thickness can be formed, in which no crack and no leak current occurs.

Furthermore, since the aforementioned porous silica film is prepared by the coating liquid, even when it is exposed to an electric field, shift in capacitance or voltage never occurs.

Furthermore, by measuring the aforementioned porous silica film by XRD (X-ray diffraction), the regularity in micropores can be evaluated. According to the present invention, as far as the obtained peak in the range of $2\theta=0.7\sim8°$ according to the XRD measurement is sharper, a porous silica film having regularly disposed micropores and of uniform sizes can be obtained.

The XRD measurement is carried out by a focusing method using 40 kV, 20 mA, Monochromator (Graphite (00002) surface) with the CuKα line. The above peak strength of the porous silica film of the present invention varies depending on its film thickness or the like so it is not particularly restricted. But the ratio of the peak to the noise (S/N ratio) is desired to be not less than 3. The porous silica film of the present invention having the S/N ratio within this range can be confirmed to have uniform micropores, so that it can be used for an optically functional material, an electronically functional material or the like.

The porous silica film according to the present invention has properties as described above, thus it can be used for an optically functional material or an electronically functional material such as an interlayer insulating film, a molecular recording medium, a transparent conductive film, solid electrolyte, an optical waveguide, an LCD color member and the like. In particular, it can be preferably used as an interlayer insulating film. Further, it can be preferably applied to a semiconductor device (circuit) and the like.

EXAMPLES

The present invention is now more specifically illustrated below with reference to Examples. However, the present invention is not restricted to these Examples.

Incidentally, the following raw materials were used in Example and Comparative Examples.

<Tetraethoxysilane>

EL Grade: $Si(OC_2H_5)_4$, a product of Kojundo Chemical Laboratory Co., Ltd.

<Ethanol>

For electronic industry, a product of Wako Pure Chemical Industries, Ltd.

<Hydrochloric Acid>

For trace analysis, a product of Wako Pure Chemical Industries, Ltd.

<Poly(Alkylene Oxide) Block Copolymer>

70 g of $HO(CH_2CH_2O)_{20}(CH_2CH(CH_3)O)_{70}(CH_2CH_2O)_{20}H$ (Pluronic P123, manufactured by BASF) was weighed and dissolved in 700 g of the ethanol for electronic industry. The resulting solution was subjected to ion exchange using an ionic exchange resin (SK1BH) manufactured by Nippon Rensui Co., and removing ethanol by distillation. Poly (alkylene oxide) block copolymer subjected to a demetallization treatment in this manner was used.

<Water>

Demetallized water by a water purification system manufactured by Millipore Corporation was used.

<N,N-dimethylacetamide>

For electronic industry, a product of Kanto Chemical Co., Inc

<Glycine>

$H_2NCH_2COOH$, a product of Mitsui Chemicals, Inc.

According to a method as described in JP1998-130214A, ammonia and carbon dioxide were added to glycolonitrile in a solution and the mixture was heated for synthesizing.

<Cetyltrimethylammonium Chloride>

TCl-EP: $C_{16}H_{33}(CH_3)_3N\cdot Cl$, a product of Tokyo Kasei Kogyo Co., Ltd.

Furthermore, the metal content and the preservation stability of a coating liquid for forming a porous silica film were measured as follows.

<Measurement of the Metal Content of a Coating Liquid for Forming a Porous Silica Film>

A coating liquid with indium added as an internal standard substance thereto was analyzed using an inductively coupled plasma mass analyzer (7500S, a product of Agilent Technologies Inc.) into which a mixed gas of argon and oxygen was fed, and the metal content was quantitatively analyzed by the calibration method.

<Measurement of the Preservation Stability of a Coating Liquid for Forming a Porous Silica Film>

Using a coating liquid right after the preparation thereof, a porous silica film was prepared. The peak strength of this film by the XRD measurement was measured and defined as S0 as a reference value. Then, the coating liquid was put into a closed vessel, and stored at 10° C. After it was stored for a certain period of time, a film was prepared from the coating liquid taken out of the vessel. The peak strength of this film by XRD was measured, and defined as S1. The values of S0 and S1 were average values measured at three arbitrary points of the obtained films.

The ratio of the peak value of the measured value S1 to that of the reference value S0 (S1/S0) was defined as s (stability index). As far as the value of s is larger, such a value indicates that the regularity is high and the stability of the coating liquid for forming a silica film is high.

Furthermore, the preservation stability of the porous silica film of the present invention was also confirmed by preparing a film from the coating liquid taken out of the vessel after the coating liquid was kept at 10° C. and kept for a predetermined period of time, and measuring its dielectric constant. To measure the dielectric constant, aluminum electrodes were prepared on a surface of the porous film on the substrate and a back surface of a silicon wafer used as a substrate by the deposition method. The dielectric constant was measured according to a usual method at 25° C. under an atmosphere of a 0% relative humidity at a frequency of 100 kHz. The stability of the coating liquid for forming a silica film can be evaluated by the changing rate represented by the following formula, $$\Delta d = |d_n - d_1|/d_1$$

wherein $d_1$ is the permittivity of a silica film obtained from the coating liquid stored for one day; and $d_n$ is the permittivity of a silica film obtained from the coating liquid stored for n days. The smaller the Δd value is, the higher the preservation stability is.

Example 1

In a clean room managed not to allow a metal to enter into a solution, a coating liquid was prepared. A vessel or an apparatus in use was subjected to a demetallization treatment by washing with a 10 weight % nitric acid, and by washing with demetallized water. Firstly, 10.0 g of tetraethoxysilane and 10 mL of ethanol were mixed at a room temperature, followed by stirring. Then, 1.0 mL of 1N hydrochloric acid (corresponding to 0.02 mole of hydrochloric acid and 1 mole of water, based on 1 mole of tetraethoxysilane; further, corresponding to 0.25 mole of water, based on 1 mole of the ethoxy group) was added thereto and the mixture was further stirred at 50° C. for one and a half hours. Subsequently, a solution obtained by dissolving 2.8 g of poly(alkylene oxide) block copolymer (corresponding to the amount of the $W_{CR}$ value to be 1.0) in 40 mL of ethanol was added to the aforementioned liquid and mixed. Then, 8.0 mL of water (9.2 mole, based on 1 mole of tetraethoxysilane) was added thereto, followed by stirring for 50 minutes, and then 20 mL of N,N-dimethylacetamide was added and mixed, following by further stirring for 40 minutes. Glycine was added to the obtained coating liquid such that 800 ppm of glycine is contained and the mixture was stirred. A transparent homogeneous coating liquid was obtained. The metal content of the coating liquid was measured. As a result, the metal content was not more than 11 ppb.

1.5 mL of this coating liquid was put on a surface of a silicon wafer having a diameter of 2 inches, rotated at 2000 rpm for 60 seconds to prepare a coated film (wet condition) on the surface of the silicon wafer. The obtained coated film was dried at 100° C. for 60 minutes and further calcined in the air at 400° C. for 180 minutes to prepare a film. The obtained film was analyzed by X-ray. As a result, the film had a periodic hexagonal structure with area intervals of 7.0 nm.

Figure 1:
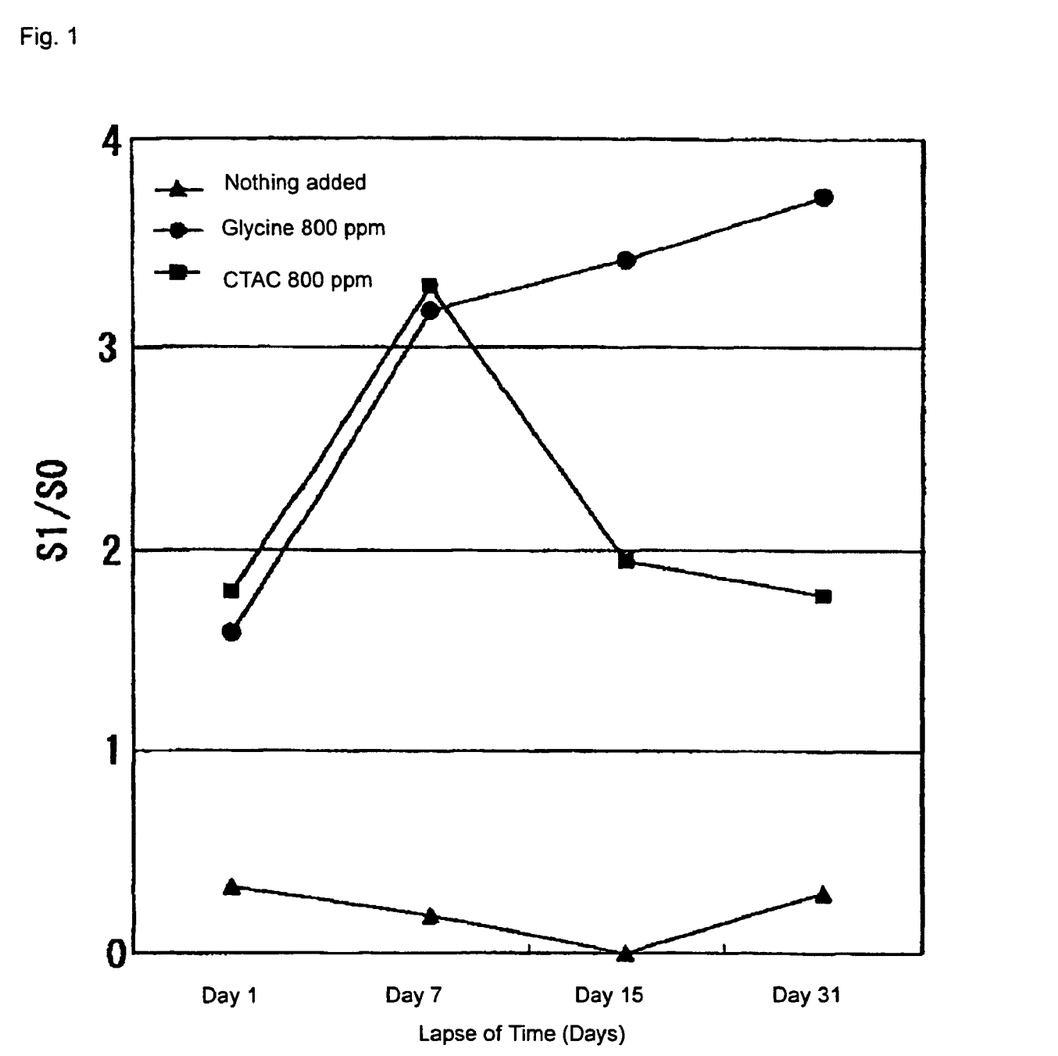
FIG. 1 is a view illustrating a relationship between the shelf life of the coating liquid for forming porous silica and the X-ray diffraction measurement results of the porous silica film obtained by using the appropriate coating liquid.

This coating liquid was put into a closed vessel, and left alone at 10° C. for 1 day, 7 days, 15 days and 31 days. Then, the coating liquid was taken out of the closed vessel, and a film was prepared by coating the surface of the silicon wafer under the same conditions as described above. The results of X-ray diffraction measurement of the obtained film are shown in FIG. 1.

The film obtained from the aforementioned coating liquid was confirmed to have kept its structural regularity high, regardless of the shelf life of the coating liquid.

Figure 2:
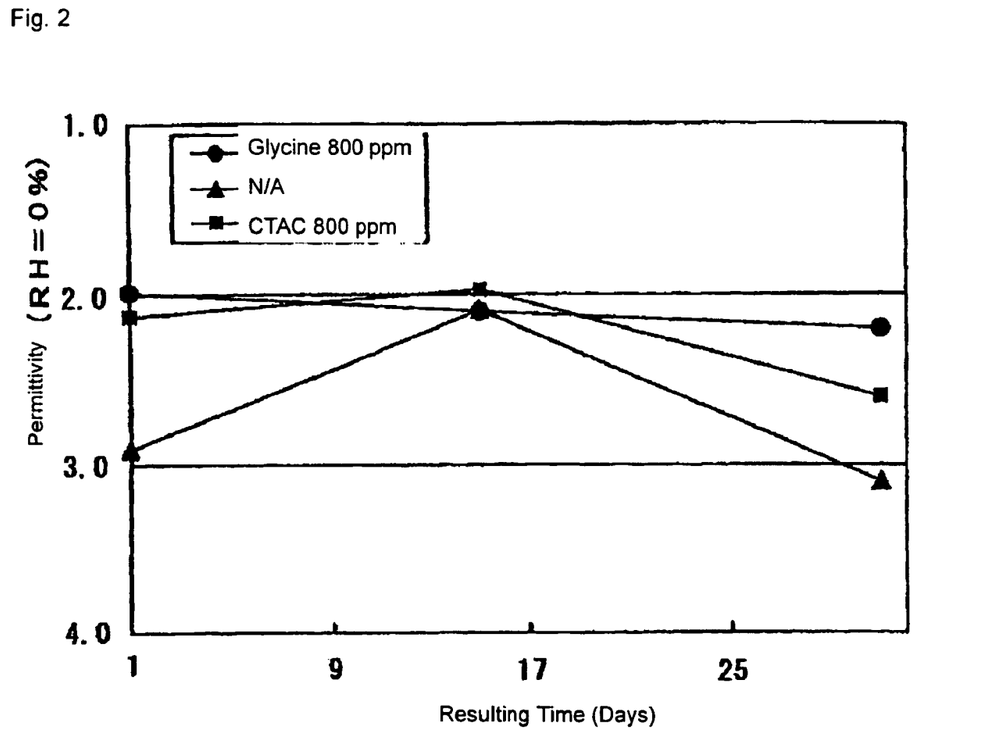
FIG. 2 is a view illustrating a relationship between the shelf life of the coating liquid for forming porous silica and the dielectric constant measurement results of the porous silica film obtained by using the appropriate coating liquid.

Further, using the coating liquid which was put into the closed vessel and left alone at 10° C. for 1 day, 15 days and 31 days, the dielectric constant of a film prepared under the same conditions as described above was measured. The results are shown in FIG. 2.

The permittivity (d1) of the silica film obtained by using the coating liquid stored for one day was 2.0 at the dry state. Furthermore, the film obtained form the above coating liquid had Δd suppressed to within 10% regardless of the shelf life of the coating liquid, so the above coating liquid was confirmed to have very high stability.

Comparative Example 1

A coating liquid was prepared and evaluated under the same conditions as in Example 1, except that glycine in Example 1 was not added. The metal content of the coating liquid was 7.4 ppb.

A film obtained from the coating liquid right after the preparation thereof had a periodic hexagonal structure with area intervals of 7.0 nm.

The relationship between the X-ray diffraction measurement results and the shelf life of the coating liquid is shown in FIG. 1. By storing the coating liquid just for one day, it was found that the structural regularity of the obtained film was considerably deteriorated.

The relationship between the dielectric constants and the shelf life of the coating liquid is shown in FIG. 2. The permittivity $d_1$ was 2.9. Further, the change in the permittivity in relative to the shelf life was abrupt so that the coating liquid was confirmed to be very unstable.

Comparative Example 2

A coating liquid was prepared and evaluated in the same manner as in Example 1, except that cetyltrimethylammonium chloride was added instead of glycine in Example 1. The content of various metals in the coating liquid was not more than 20 ppb.

A film obtained from the coating liquid right after the preparation thereof had a periodic hexagonal structure with area intervals of 7.0 nm.

The relationship between the X-ray diffraction measurement results and the shelf life of the coating liquid is shown in FIG. 1. The film obtained from the coating liquid had maintained the structural regularity relatively high regardless of the shelf life, whereas when 15 days of the shelf life passed, it was found that the regularity began to be deteriorated.

The relationship between the dielectric constants and the shelf life of the coating liquid is shown in FIG. 2. The dielectric constant also began to change when 15 days of the shelf life passed. At the 31st day, Δd became 20%. Thus, it was found that the self-life stability was deteriorated.

From the above results, it became clear that the coating liquid for forming porous silica of the present invention had superior stability and the obtained porous silica or the porous silica film had proper properties for use in an interlayer insulating film having high regularity in micropores and low permittivity.

INDUSTRIAL APPLICABILITY

According to the coating liquid for forming porous silica and the preparation method of the aforementioned coating liquid according to the present invention, a coating liquid exhibiting superior self-life stability can be provided. Furthermore, the porous silica film of the present invention prepared by using the aforementioned coating liquid, even when it is exposed to an electric field, never causes shift in capacitance or voltage, has regularly disposed uniform micropores and the like. Such excellent properties of the porous silica film do not change so that the porous silica film can be properly used as an optically functional material or an electronically functional material. Accordingly, the coating liquid for forming porous silica of the present invention as a raw material of porous silica is greatly meaningful on industrial scale.

The invention claimed is:
1. A coating liquid for forming porous silica comprising:
(A) an alkoxysilane compound;
(B) a surfactant; and
(C) an organic ampholyte,
and having a metal content of not more than 50 ppb.

2. The coating liquid for forming porous silica according to claim 1, wherein (C) the organic ampholyte is (C1) an amino acid and/or peptide.

3. The coating liquid for forming porous silica according to claim 1, wherein (C) the organic ampholyte is contained in the amount of from 0.1 to 6000 ppm in the coating liquid for forming porous silica.

4. The coating liquid for forming porous silica according to claim 1, wherein (A) the alkoxysilane compound is a partial hydrolysis-condensation product of (A1) an alkoxysilane compound.

5. The coating liquid for forming porous silica according to claim 1, wherein the $W_{CR}$ value defined by the following formula is in the range of 0.5 to 3.0, $$W_{CR}=W_C/(60.09 \times M_{Si}) \quad \text{(Formula 1)}$$

wherein $W_C$ represents a mass of (B) the surfactant (unit: gram); and $M_{Si}$ represents the molar amount of (A) the alkoxysilane compound in terms of silicon.

* * * * *